United States Patent [19]

Rosenberg

[11] Patent Number: 5,696,563
[45] Date of Patent: Dec. 9, 1997

[54] APPARATUS AND METHODS FOR PERFORMING HUFFMAN CODING

[75] Inventor: Jonathan David Rosenberg, North Plainfield, N.J.

[73] Assignee: Lucent Technologies Inc., Murray Hill, N.J.

[21] Appl. No.: 400,707

[22] Filed: Mar. 8, 1995

[51] Int. Cl.$^6$ ................................................. H04N 5/14
[52] U.S. Cl. .......................... 348/699; 348/422; 341/65; 341/67; 358/427
[58] Field of Search ........................ 341/65, 67, 51, 341/106, 55; 348/418, 18, 14, 19, 400, 423, 699, 422; 358/427; 395/200.18; H04N 5/14

[56] References Cited

U.S. PATENT DOCUMENTS

| | | | |
|---|---|---|---|
| 3,701,111 | 10/1972 | Cocke et al. | 341/67 |
| 4,396,906 | 8/1983 | Weaver | 358/427 |
| 4,700,175 | 10/1987 | Bledsoe | 341/65 |
| 4,953,196 | 8/1990 | Ishikawa et al. | 348/18 |
| 5,389,965 | 2/1995 | Kuzma | 348/14 |
| 5,420,639 | 5/1995 | Perkins | 348/418 |
| 5,434,622 | 7/1995 | Lim | 348/400 |
| 5,463,699 | 10/1995 | Wilkinson | 382/246 |
| 5,541,595 | 7/1996 | Meyer | 341/67 |
| 5,541,640 | 7/1996 | Larson | 348/19 |

Primary Examiner—Tommy P. Chin
Assistant Examiner—Y. Lee

[57] ABSTRACT

Apparatus and methods are provided for generating a Huffman Code for use in compressing a received digital signal. The digital signal includes a plurality of digital sets wherein ones of the digital sets are non-unique. Ones of the digital sets are stored. Each stored digital set has associated therewith a codeword and an indicator. The indicator represents a probability of occurrence, or frequency, of the stored digital set within the digital signal. While more than one associated indicator remains stored, pairs of associated indicators are selectively combined and a first digital set associated with a first indicator and a second digital set associated with a second indicator are both associated with the selectively combined indicator. A first binary value is appended to the codeword associated with the first digital set and a second binary value is appended to the codeword associated with the second digital set.

26 Claims, 9 Drawing Sheets

APPARATUS AND METHODS FOR PERFORMING HUFFMAN CODING

CROSS-REFERENCE TO RELATED APPLICATIONS

The present invention is related to U.S. patent application Ser. No. 08/399,084, Attorney Docket No. Rosenberg 2, entitled "Apparatus and Methods for Determining an Initial Huffman Coding Rate"; U.S. patent application Ser. No. 08/400,706 Attorney Docket No. Rosenberg 3, entitled "Apparatus and Methods for Selectively Reducing a Huffman Coding Rate"; and U.S. patent application Ser. No. 5,612,747, entitled "Method and Apparatus for Vector Quantization Caching in a Real Time Video Coder", which are all commonly assigned to the assignee of the present invention, and which are filed concurrently herewith. The disclosures of these related Applications are incorporated herein by reference.

TECHNICAL FIELD OF THE INVENTION

The present invention relates generally to signal compression, and in particular to apparatus and methods for performing Huffman Coding.

BACKGROUND

Conventional communication systems, including networks, include two or more interconnected nodes wherein each node functions as a junction point within the system. Information is transferred between nodes using electric, light, and/or radio waves, and typically involves transferring one or more codewords. Each codeword represents a symbol in a symbol set, such as an alphabet, and includes data for use by, and/or instructions for, a receiving node. Each codeword is defined by one or more binary digits, or bits.

Communication systems have limited bandwidth. In other words, there exists an upper limit, or maximum number, of bits which may be transferred per unit time. Contrary to this limitation is the need of many communication systems to transfer large quantities of symbols. This is particularly true in video applications, such as videophone and direct television, where video symbols typically represent chrominance and/or luminance values for picture elements ("pixels"), motion information, instructions indicating the content of the chrominance, and luminance values or marker codes. Marker codes are sync codes.

Data compression techniques have been incorporated into many communication systems to increase the number of codewords transferred given the available bandwidth. These techniques eliminate unnecessary data, redundancies, and the like from transmissions. Huffman Coding is one popular approach which is commonly used for video, audio/speech and high-speed data compression. Huffman Codes use variable length symbols wherein each symbol's length depends upon the probability of occurrence of the one or more codewords defining it.

Assume for example a symbol set of {bear, dart, wear, beet}. Each of the codewords used to represent the symbol set has a length inversely proportional to its symbol's usage. Assuming this symbol set is used in the English language, "wear" is likely to be said more often than "bear", more often than "dart", and more often than "beet". The coding may accordingly be {be, dar, w, beet}, where codeword length is equivalent to the number of letters. In point of fact, the English language presents another good example of variable length codewords wherein common words such as {it, in, a, car, the, if, I, a, an} are shorter than words used less frequently, such as {approximately, university, automobile, individually, myself, particularly}.

Source entropy is an optimal "loss-less" coding rate, in other words, the smallest average number of bits per symbol required to represent a particular symbol set or alphabet. Huffman Coding techniques have been found to reduce coding rates to nearly source entropy. In many conventional applications, such as video processing, however, the probability of all occurrences of the various symbols tends to change as the video image changes. This causes the current Huffman Codes to be an inefficient representation of the symbols. Worse, these changes typically occur at random.

The Huffman Codes accordingly cease to reduce coding rates to source entropy and require recalculation. This is often computationally difficult as the codeword for any one symbol depends on the probability of occurrence of the symbols in the alphabet. For large alphabets therefore each codeword, of which there are typically many, requires substantial computation.

One conventional solution periodically recalculates the Huffman Codes. Another solution determines the source entropy, and then estimates from that determination the coding rate for recalculating the Huffman Codes. Each approach is typically inaccurate, and in many situations demands substantially the same processing resource requirements needed to recalculate the Huffman Codes as when originally defined. The inability of conventional communication systems to generate, and regenerate, Huffman Codes to maintain substantially source entropy remains a dominant obstacle to producing high quality video, audio/ speech and high-speed communication.

SUMMARY OF THE INVENTION

Communication systems have limited bandwidth, i.e., a maximum rate at which bits may be transferred per a given time period. Recall that compression techniques, and in particular Huffman Coding techniques, are incorporated into conventional signal compressing systems to increase information throughput, i.e., the number of codewords transferred given the available bandwidth.

Broadly, the present invention is directed to apparatus and methods for performing Huffman Coding in communication systems, including without limitation, processing system networks (including local and wide area networks), telephony systems (including videophone and cellular technologies), direct television systems, satellite systems, land-mobile radio systems, broadcast systems, data storage/retrieval systems, and the like.

An apparatus in accordance with the principles of the present invention generates a Huffman Code for use in compressing a digital signal, and includes receiving, storage and processing means. The receiving means operates to receive the digital signal, which includes a plurality of digital sets wherein ones of the digital sets are non-unique. The storage means operates to store ones of the digital sets. The processing means operates to generate the Huffman Code. An important aspect of any apparatus in accordance with the principles of the present invention is that it may be processing system, firmware or hardware based.

The processing means, more particularly, operates to store ones of the digital sets and to associate with each stored digital set a codeword and an indicator, the indicator representing a probability of occurrence of that stored digital set within the digital signal.

The processing means, preferably while more than one associated indicator remains stored, selectively combines pairs of associated indicators such that a first digital set associated with a first indicator and a second digital set associated with a second indicator are associated with the selectively combined indicator. First and second binary values are appended to the associated codeword of the first and second digital sets, respectively.

A method in accordance with the principles of the present invention concerns the generation of a Huffman Code, which may be in the form of a data structure, for use in compressing a digital signal. The digital signal includes a plurality of digital sets wherein ones of the digital sets are non-unique. Ones of the digital sets are stored and have associated therewith a codeword and an indicator, the indicator representing a probability of occurrence for the stored digital set within the digital signal. While more than one associated indicator remains stored, pairs of associated indicators are selectively combined such that a first digital set associated with a first indicator and a second digital set associated with a second indicator are associated with the selectively combined indicator, and first and second binary values are appended to the associated codeword of the first and second digital sets, respectively.

One embodiment for using and/or distributing the present invention is as software. The software embodiment includes a plurality of processing system instructions which are stored to a storage medium. Preferred storage mediums include without limitation magnetic, optical, or semiconductor chip, as well as suitably arranged combinations thereof. The processing system instructions are readable by a processing system, and upon execution, operate to control at least one processing system for compressing a signal using Huffman Coding techniques in accordance with the principles of the present invention.

BRIEF DESCRIPTION OF THE DRAWINGS

For a more complete understanding of the present invention, and the advantages thereof, reference is now made to the following Detailed Description of the Invention, taken in conjunction with the accompanying drawings in which like numbers designate like parts, and in which.

DETAILED DESCRIPTION OF THE INVENTION

Figure 1:
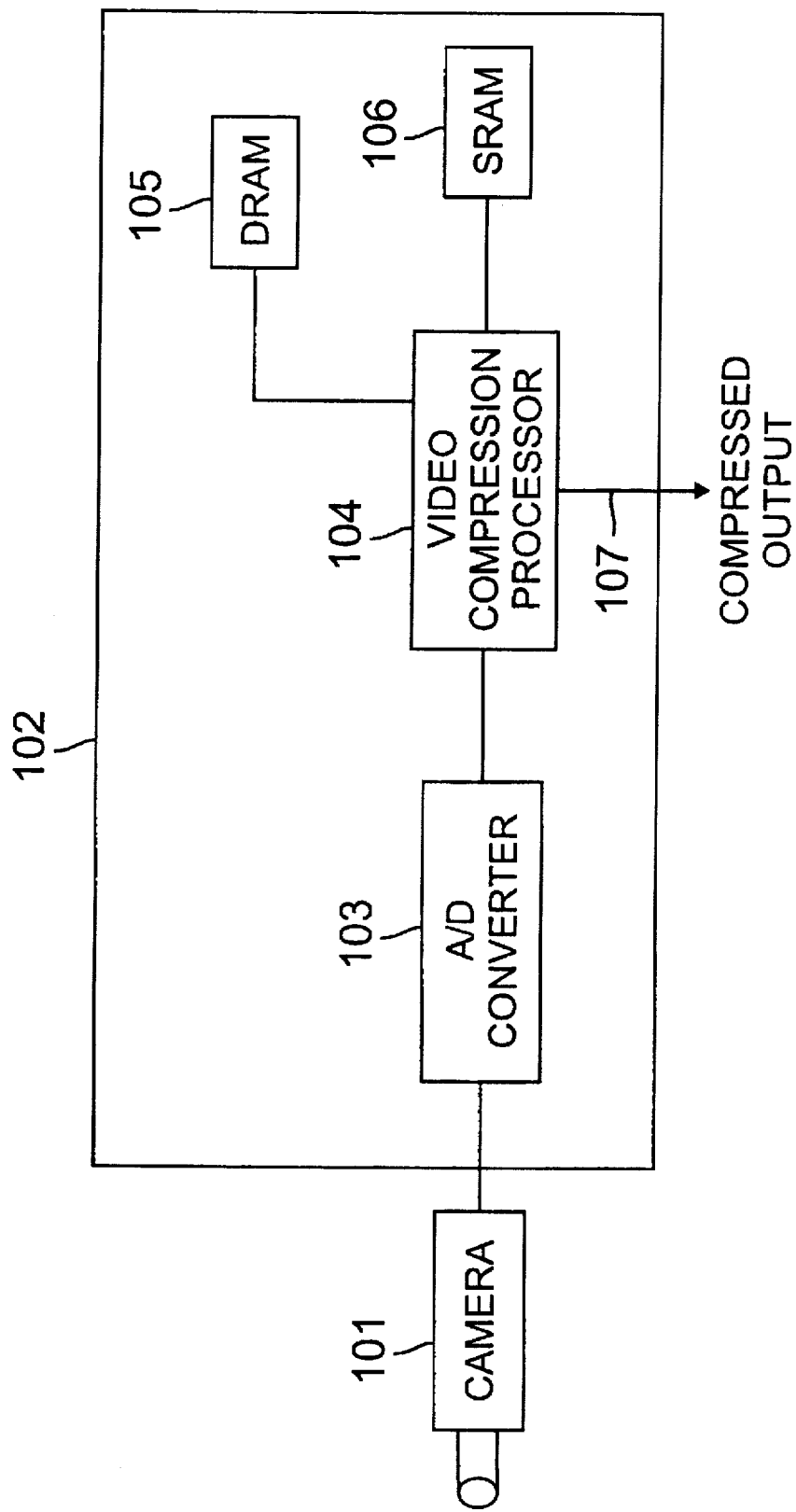
FIG. 1 illustrates a block diagram of one exemplary system for compressing video data in accordance with the principles of the present invention.

FIG. 1 illustrates a block diagram of one exemplary system for compressing video signals in which the principles of the present invention are particularly advantageous. The exemplary system includes a conventional video camera 101 and a video processing board 102. Video processing board 102 includes an analog-to-digital ("A/D") converter 103, a video compression processor 104 and two conventional memory storage devices, namely, a dynamic random-access memory ("DRAM") 105 and a static random-access memory ("SRAM") 106.

Video camera 101 may suitably be connected to A/D converter 103 to convert analog video signals produced by video camera 101 to a representative digital signal. A/D converter 103 may suitably be connected to video compression processor 104. Video compression processor 104 preferably has associated with it DRAM 105 as well as SRAM 106. Compressed video signals produced by video compression processor 104 may be transmitted over a data line 107.

In a preferred embodiment, camera 101 is a model no. YH-7B60, made by Sharp Corp., Osaka, Japan; A/D converter 103 is a model no. SAA7151, made by Philips' Gloeilampenfabrieken N.V., the Netherlands; and Video compression processor 104 is a model no. VCP rev 3, made by Integrated Information Technologies Inc., Santa Clara, Calif., U.S.A. DRAM 105 and SRAM 106 are conventional suitably arranged storage devices. One preferred use of this video compression system is discussed in U.S. patent application Ser. No. 08/400,704, Attorney Docket No. Hartung 10-1, which is commonly assigned to the assignee of the present invention and which is incorporated herein by reference.

Figure 2:
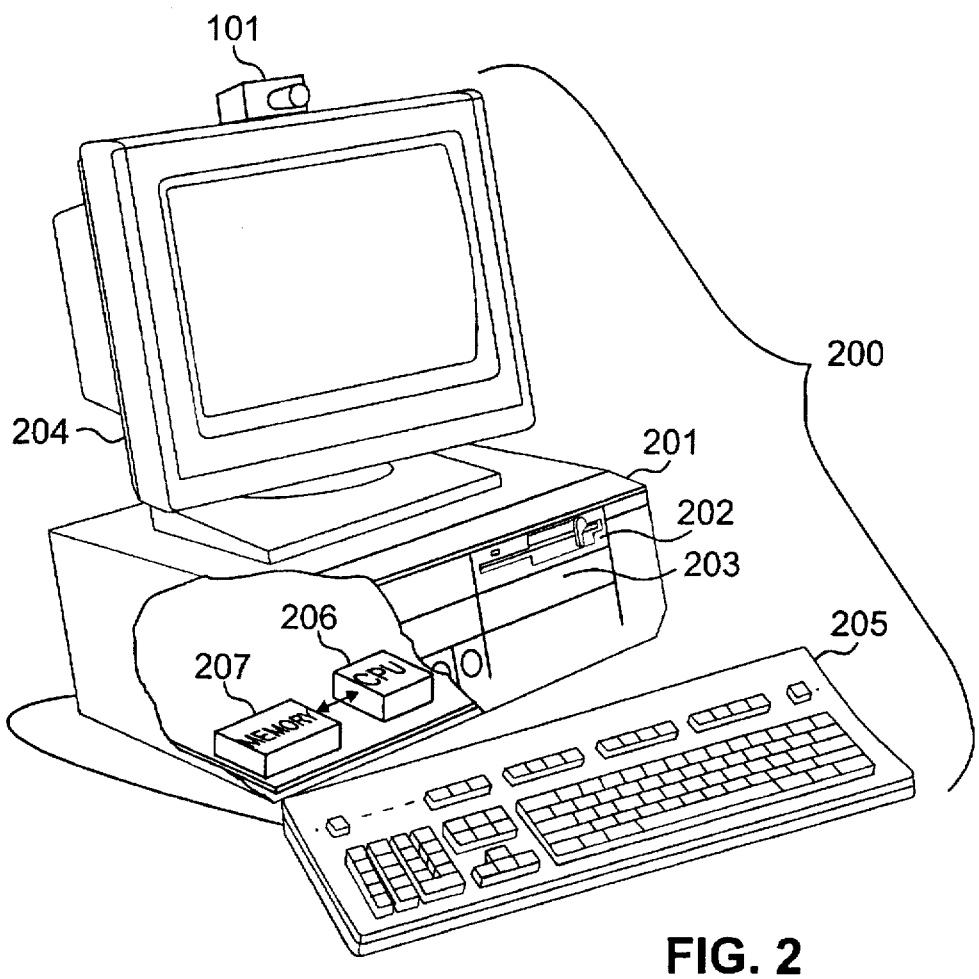
FIG. 2 illustrates an isometric view of one exemplary processing system for compressing video data in accordance with the principles of the present invention.

FIG. 2 illustrates an isometric view of an exemplary processing system 200 for compressing a video signal in accordance with the principles of the present invention. Processing system 200 is shown as a personal computer, and in one preferred embodiment is a model no. System 3333, by AT&T GIS, located in Dayton, Ohio. Processing system 200 may suitably be coupled with camera 101, and includes a hardware casing 201, having both a floppy disk drive 202 and a hard disk drive 203, a monitor 204 and a keyboard 205. Monitor 204 and keyboard 205 may be replaced by, Or combined with, other conventional output and input devices, respectively.

Floppy disk drive 202 is operable to receive, read and write to external disks. Hard disk drive 203 is operable to provide fast access storage and retrieval. Floppy disk drive 202 may be replaced by or combined with any conventional suitably arranged structure for receiving and transmitting data and instructions, including without limitation, tape and compact disc drives, telephony systems and devices (including videophone technologies), and serial and parallel ports. In alternate embodiments, circuit boards, such as video processing board 102 of FIG. 1 for example, may be included.

Camera 101 is preferably coupled with processing system 200 through one of the aforementioned ports. In alternate embodiments, input video images may be received via one or more separate storage devices, such as a floppy disk or a compact disc, for example. An important aspect of the exemplary embodiment therefore is that data and/or instruction collection and compression need not occur coincidentally.

Note that hardware casing 201 is illustrated with a cut-away portion which includes a processing unit 206 suitably coupled with a memory storage device 207. Memory storage device 207 may be a random access memory ("RAM") or a read only memory ("ROM"), or other conventional suitably arranged memory storage device, such as DRAM 105 and/or SRAM 106 of FIG. 1 for example. Although processing system 200 is illustrated as having a single processing unit, a single hard disk drive and a single memory unit, processing system 200 may be equipped with a plurality of processing units and/or suitably arranged memory storage devices operable to cooperatively carry out the principles of the present invention.

It should be noted that although the present invention is particularly advantageous for use in video compression, the present invention is also well suited for use with other systems utilizing signal compression, including without limitation, processing system networks (including local and wide area networks), telephony systems (including videophone technologies), direct television systems, satellite systems, land-mobile radio systems, broadcast systems, information storage/retrieval systems, and the like.

Although a personal computer is utilized to illustrate one exemplary processing system embodiment, the principles of the present invention may be implemented within any processing system having conventional suitably arranged processing means for performing Huffman Coding in accordance with the principles of the present invention, including without limitation, cameras, videophones, telephones, televisions, sophisticated calculators and, hand-held, laptop/ notebook, mini, mainframe and super computers, including RISC and parallel processing architectures, as well as within processing system network combinations of the foregoing. Conventional processing system architecture is more fully discussed in *Computer Organization and Architecture*, by William Stallings, MacMillan Publishing Co. (3rd ed. 1993), which is incorporated herein by reference.

Other preferred embodiments of the present invention include, without limitation, implementations in firmware or hardware. Such exemplary embodiments may include suitably arranged circuitry, including programmable logic devices, such as PALs (programmable array logic), PLAs (programmable logic arrays) and DSPs (digital signal processors). Other exemplary embodiments may also include FPGAs (field programmable gate arrays) and ASICs (application specific integrated circuits), for example.

Figure 3:
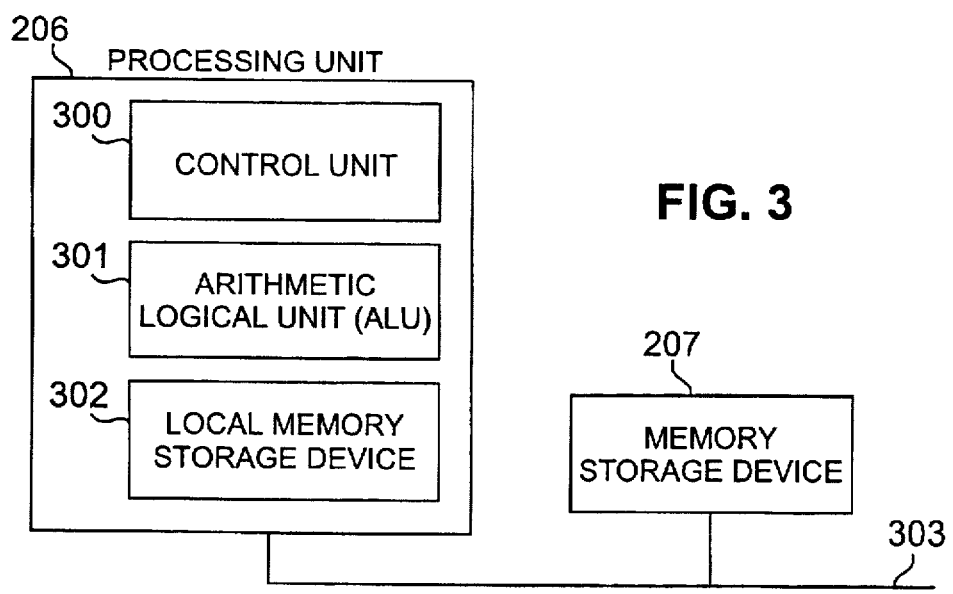
FIG. 3 illustrates a block diagram of an exemplary microprocessing system which may be utilized in conjunction with the processing system of FIG. 2.

FIG. 3 illustrates a block diagram of one exemplary microprocessing system which may be utilized in conjunction with processing system 200. The microprocessing system may be programmed to compress signals using Huffman Coding techniques in accordance with the principles of the present invention. The microprocessing system includes a single processing unit 206 coupled via data bus 303 with a single memory storage device 207. Memory storage device 207 is operable to store one or more processing system instructions which processing unit 206 is operable to retrieve and execute. Processing unit 206 includes a control unit 300, an arithmetic logic unit ("ALU") 301, and a local memory storage device 302, such as, stackable cache or a plurality of registers, for example. Control unit 300 is operable to fetch processing system instructions from memory storage device 207. ALU 301 is operable to perform a plurality of operations, including addition and Boolean AND needed to carry out those instructions. Local memory storage device 302 is operable to provide local high speed storage used for storing temporary results and control information.

Figure 4A:
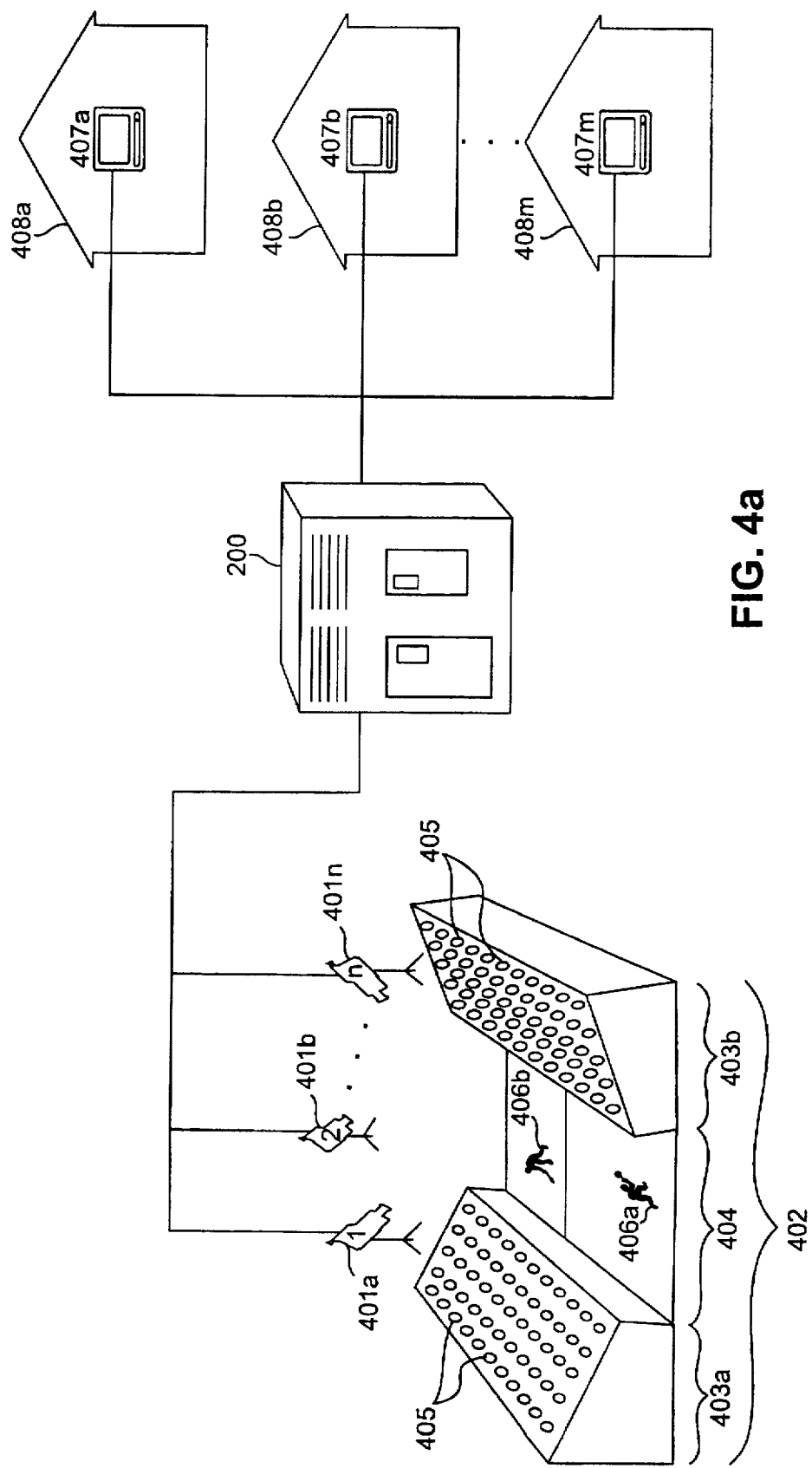
FIG. 4a illustrates a block diagram of an exemplary video processing system in accordance with the principles of the present invention.

FIG. 4a illustrates a block diagram of an exemplary video/audio processing system in which the present invention is particularly advantageous. The exemplary system includes a single processing system 200, illustrated as a mainframe computer, coupled suitably with a plurality of conventional video cameras 401a–401n. Video cameras 401a–401n are positioned about a tennis stadium 402. Tennis stadium 402 includes two grand stands 403a, 403b and a tennis court 404. Each of the grand stands 403a, 403b includes a plurality of seats, some of which will be occupied by spectators 405 during a tennis match, as illustrated. Tennis court 404 is shown to include two tennis players 406a, 406b who oppose one another in the tennis match.

One or more of the video cameras 401a–401n operate to capture the tennis match from which representative video and/or audio signals are produced. The produced signals are input to processing system 200 wherein they are processed and compressed using Huffman Coding techniques in accordance with the principles of the present invention to produce one or more output signals. The produced output signals are transmitted to a plurality of televisions 407a–407m. The televisions 407a–407m are located within a plurality of homes 408a–408m.

Figure 4B:
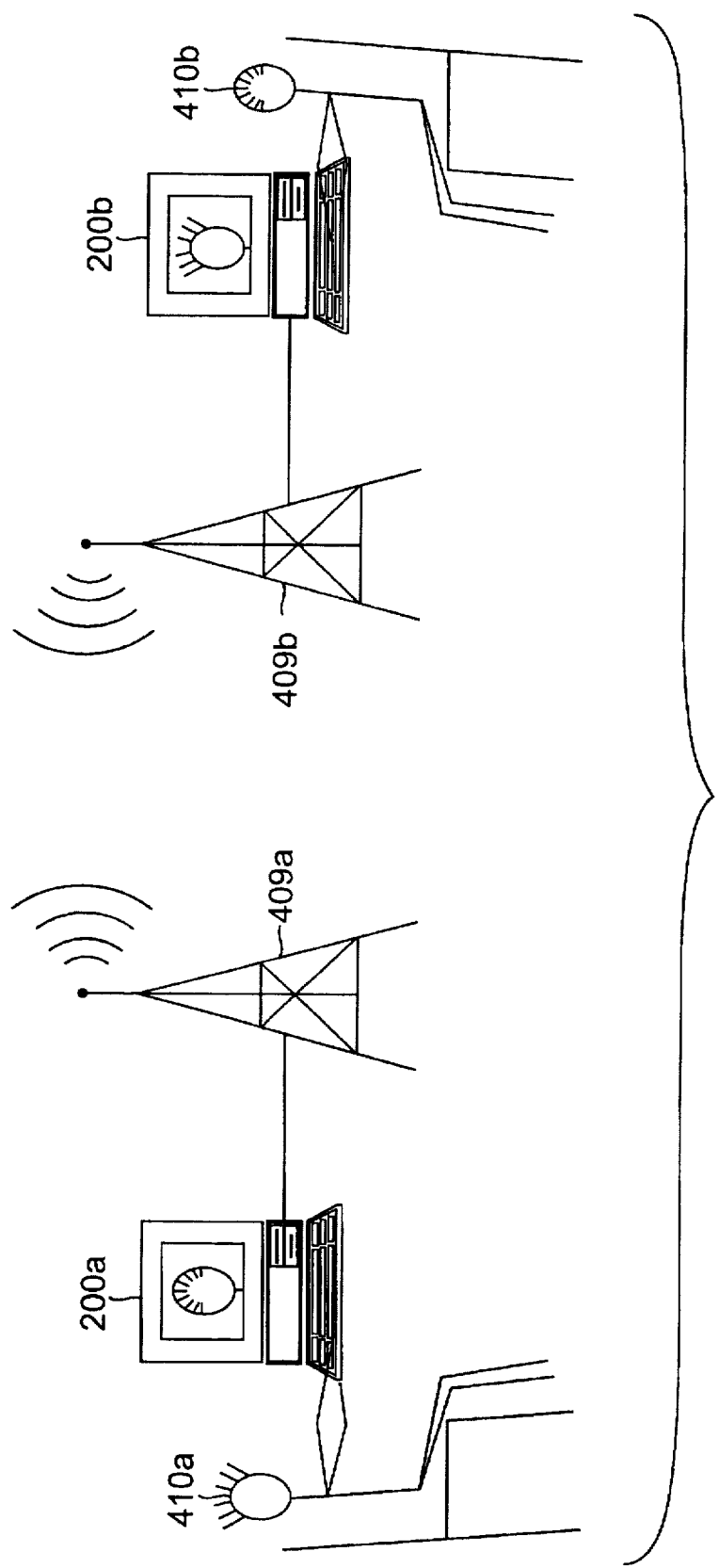
FIG. 4b illustrates a block diagram of an exemplary processing system-based wireless local area network including videophone technologies in accordance with the principles of the present invention.

FIG. 4b illustrates a block diagram of an exemplary processing system-based wireless local area network ("LAN") in which the present invention is particularly advantageous. The illustrated LAN includes two exemplary processing system nodes 200a, 200b, shown as personal computers. Each of the processing system nodes 200a, 200b is coupled suitably with a conventional antenna 409a, 409b, respectively, and includes videophone technologies (not shown). Antennas 409a, 409b operate to transmit and receive wireless communications between processing system nodes 200a, 200b. The received wireless communications are processed utilizing representative electric signals. The illustrated LAN facilitates communications between users A and B, 410a, 410b, respectively, wherein each processing system node is operable to send, receive, process and compress video, audio and high speed signals in accordance with the principles of the present invention.

Figure 4C:
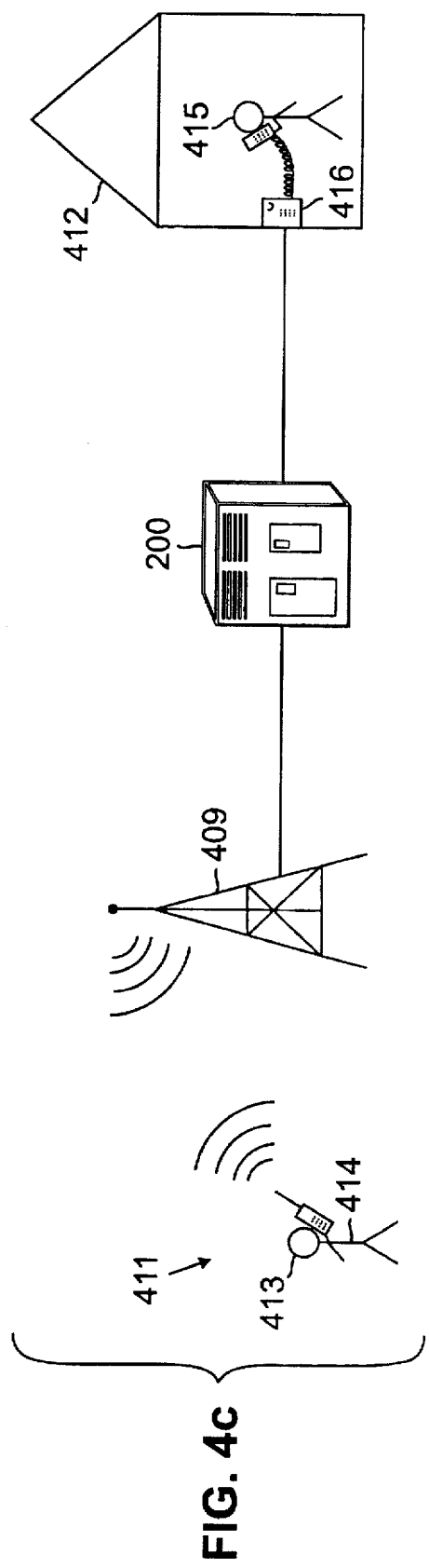
FIG. 4c illustrates a block diagram of an exemplary wireless communication system in accordance with the principles of the present invention.

FIG. 4c illustrates a block diagram of an exemplary wireless communication system in which the present invention is particularly advantageous. The illustrated system includes a processing system 200, illustrated as a mainframe computer, which facilitates communication between a first node 411 and a second node 412. The first node 411 includes a first caller 413, shown utilizing a cellular telephone 414. The cellular telephone 414 is operable to send and receive wireless communication signals. The second node 412 includes a second user 415, shown utilizing a conventional telephone 416. The conventional telephone 416 is operable to send and receive wired communication signals. Processing system 200 is suitably coupled with the conventional telephone 416 and a conventional antenna 409. Antenna 409 operates to send and receive wireless signals to and from the cellular telephone 414. Processing system 200 is operable to send, receive, process and compress audio signals in accordance with the principles of the present invention.

The video, audio and/or high speed signals of FIGS. 4a–4c are compressed using Huffman Coding techniques in accordance with the principles of the present invention to produce one or more output signals. The output signals are real physical signals.

Figure 5A:
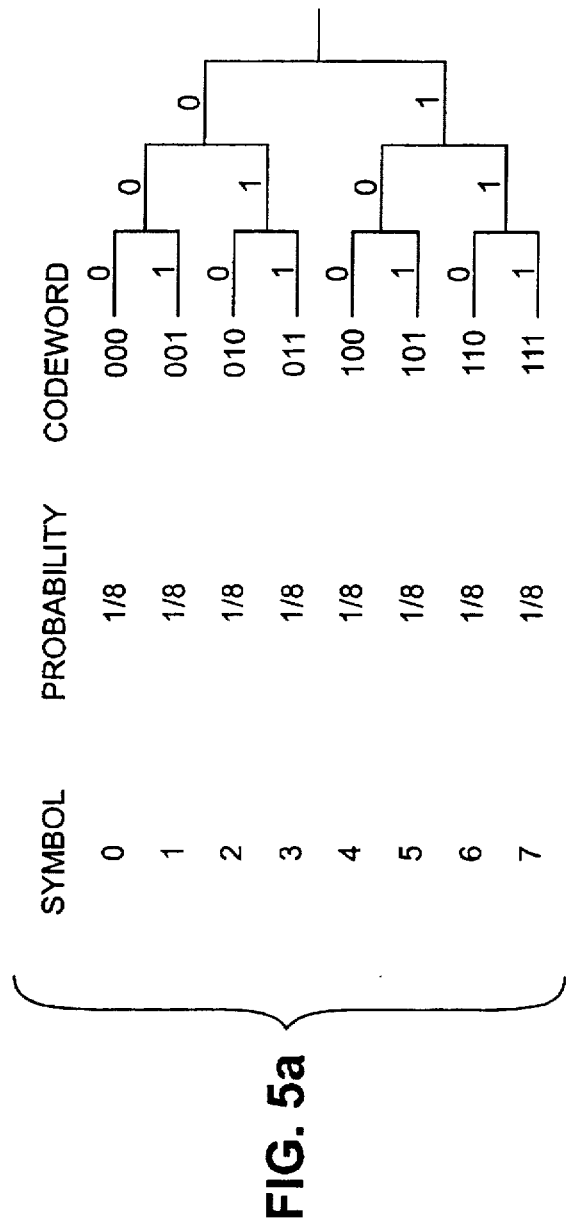
FIG. 5a illustrates a conceptual diagram for coding an equiprobable L-ary source.
Figure 5B:
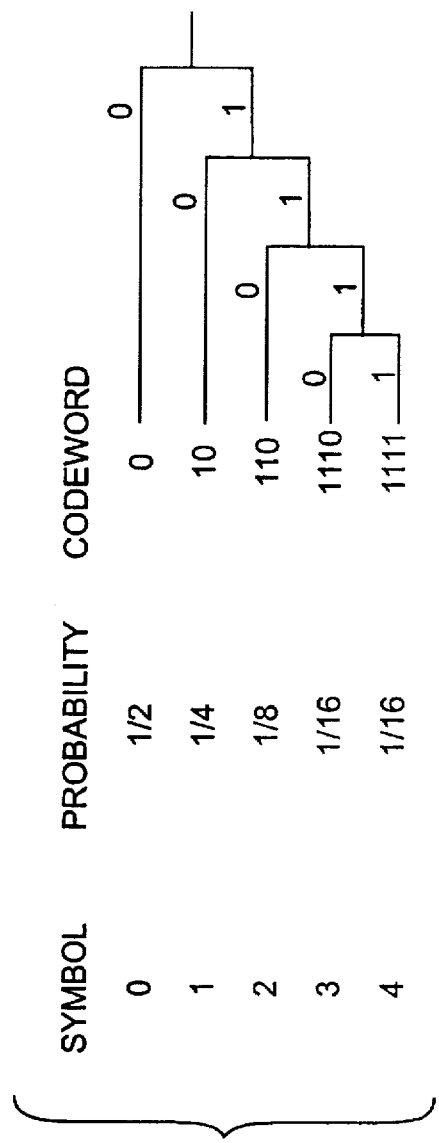
FIG. 5b illustrates a conceptual diagram for coding a nonequiprobable L-ary source.
Figure 5C:
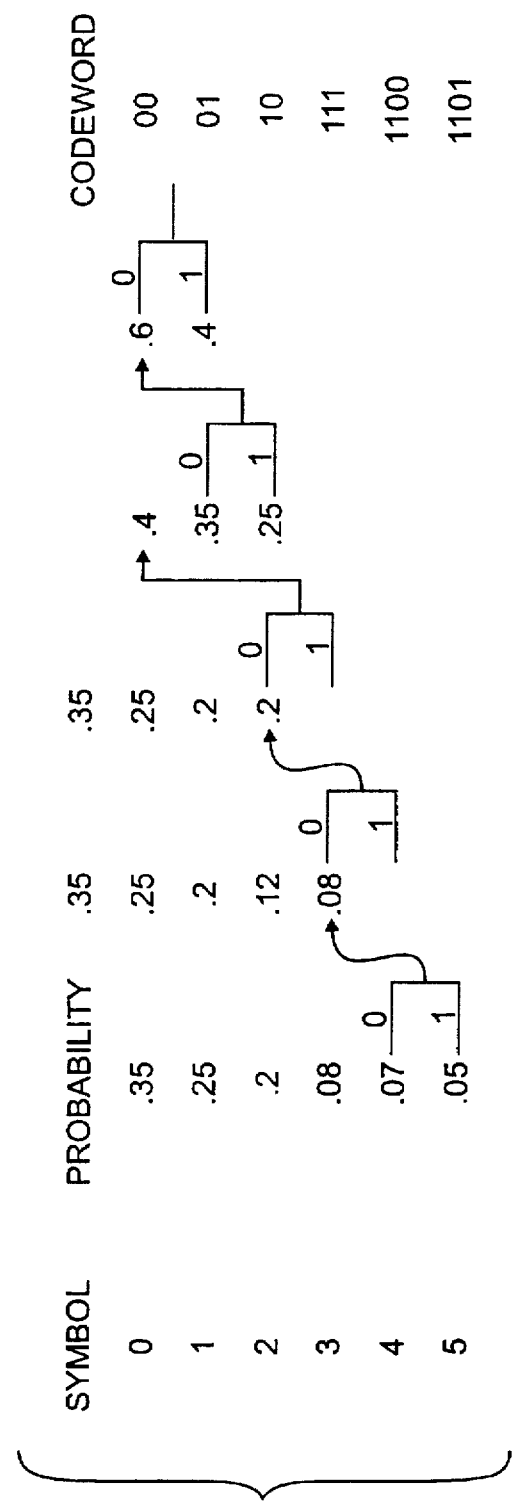
FIG. 5c illustrates a conceptual diagram for Huffman Coding a nonequi-probable L-ary source.

FIGS. 5a–5c illustrate the relationship between the entropy of a discrete source and the number of bits actually needed to encode that source. Block encoding is considered in each instance for which a symbol or sequence of symbols is mapped into a codeword, i.e., a block of bits. Recall that source entropy is a tight lower bound on minimum average codeword length.

FIG. 5a illustrates a conceptual diagram for coding an equiprobable L-ary source, wherein all symbols are equally probable and the number of symbols is a power of two, $L=2^k$. The source entropy is k bits per symbol. Possible outputs are divided into two equal groups of $2^{k-1}$ symbols. The successive splits of the groups are designated "upper" and "lower" and if a zero and a one, respectively, are assigned, a minimum length code is generated.

FIG. 5b illustrates a conceptual diagram for coding a nonequiprobable L-ary source, wherein the powers are of ½. The probabilities may be $P_i=(½)^{i+1}$, i=0,1, . . . , L−2; $P_{L-1}=(½)^{L-1}$, for example. Similar to FIG. 5a, the output is revealed in stages wherein the symbols are ordered with the highest probability symbol at the top, and the symbols are split into groups of equal probability. The first symbol is in one group and all of the other symbols are in the other. Note that the length of the codeword for the ith symbol is given by $b_i=-\log_2 P_i$.

In general, where output probabilities are arbitrary, it may be assumed that codewords are of lengths $b_i$ and satisfy $$-\log_2 P_i \leq b_i < -\log_2 P_i + 1, \tag{1}$$

Averaging equation (1) over $P_i$, it is found that $$H(X) \leq L(X) < H(X) + 1. \tag{2}$$

There accordingly exists an uniquely decipherable code whose word lengths conform to equation (1).

Huffman Codes provide codewords having a minimum average number of bits per symbol. Huffman Coding is a member of the class of codes called prefix codes wherein no codeword is the prefix of another codeword. For this codeword class, sequences of bits may be decoded uniquely and instantaneously.

Figure 5D:
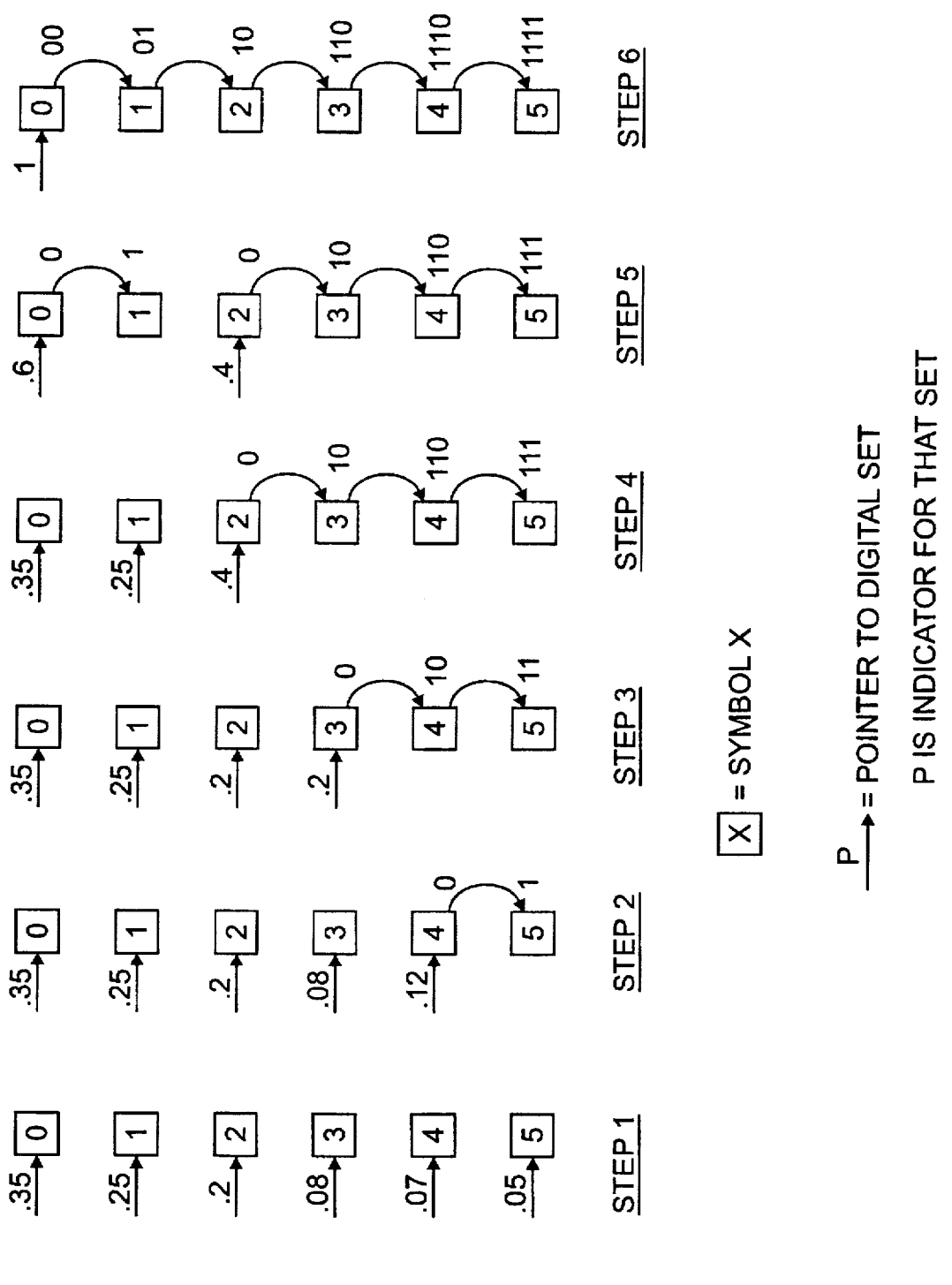
FIG. 5d illustrates the generation of pointers for the conceptual diagram of FIG. 5c.

FIG. 5c illustrates a conceptual diagram for Huffman Coding an nonequi-probable L-ary source. Huffman Coding techniques begin by listing the symbols in inverse order of probability. The two lowest probability symbols are combined, or added, into a group and a new list is formed with this group as a single entry. The list is resorted in inverse order of probability. The first step is repeated to form another list. At each step larger groups are formed and treated as a single entry. The process continues until the list contains only two entries. A zero is assigned to each member of one group and a one is assigned to each member of the other group. The process of grouping is then retraced; each of the groups is split and a zero and a one are assigned. FIG. 5d illustrates the generation of pointers for the conceptual diagram of FIG. 5c.

Figure 6:
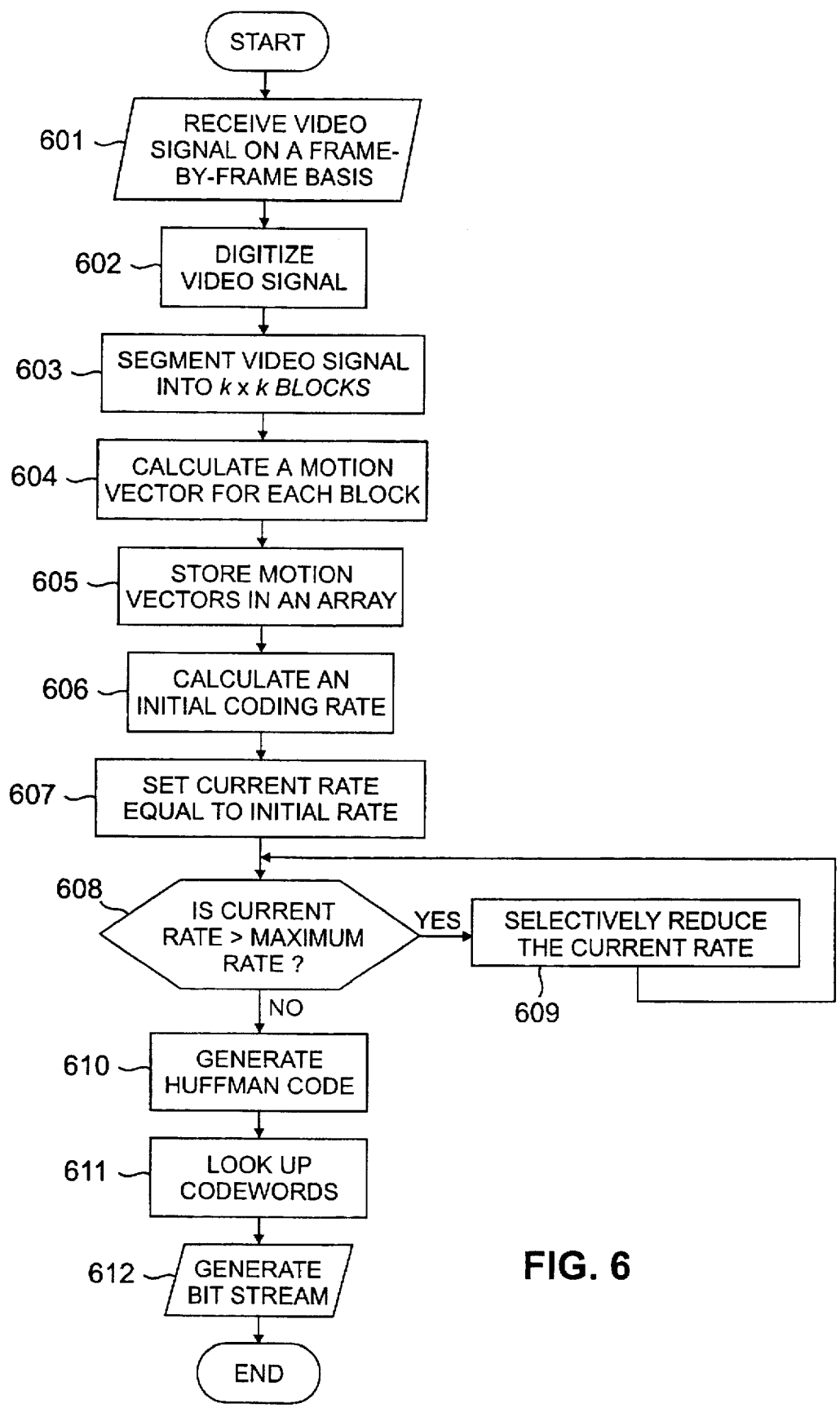
FIG. 6 illustrates an exemplary flow diagram for processing a received input signal utilizing Huffman Coding techniques in accordance with the principles of the present invention.

FIG. 6 illustrates an exemplary flow diagram for processing a received input signal utilizing Huffman Coding techniques in accordance with the principles of the present invention. For the purposes of the present discussion, the received input signal is assumed to be a video signal although the principles of the present invention may be advantageously used in conjunction with any signal compression apparatus, system or methodology. It is further assumed that the video signal is received at a constant frame rate, that each frame has a fixed number of bits, and that the bits are divided into three sections, namely, motion, vector quantization and scaler quantization information.

The process begins upon receipt of the input signal, processing block 601. If the input signal is an analog signal, it is preferably digitized, processing block 602. In the event that the signal is already in a digital format, this processing step is bypassed.

The video signal is preferably segmented into blocks wherein each block preferably contains k×k pixels, processing block 603. Alternate embodiments may use non-square blocks. In the illustrative embodiment k is equal to eight, and each video frame preferably includes 8,960 pixels which are divided into 140 blocks (14 blocks horizontally and 10 blocks vertically). In alternate embodiments, particularly non-video embodiments, this processing step may be bypassed.

Motion estimation between consecutive video frames is preferably accomplished by comparing a current video frame with a previous reference video frame to determine one or more motion vectors corresponding to one or more blocks, processing block 604. This is preferably accomplished using forward motion estimation wherein each block of the current frame is searched for in the previous reference frame.

The techniques for calculating motion vectors are known, and may range from full search motion estimators to narrower selective search motion estimators, such as a coarse-fine search, for example. In video processing, selective search motion estimators are preferred due to reduced processing resource requirements. Assuming that a full search is done, it is preferable to use motion vectors in the range of −5 to 5 pixels at a resolution of 112×80, in increments of ⅓ pixels, for a total of 31 possible motion vectors in two dimensions. Sub-pixel motion estimation is accomplished by interpolating up to preferably 336×240 resolutions, and then searching in a range of −15 to 15 pixels, in one pel increments.

The motion estimator is preferably biased towards a zero motion vector. If the prediction error for a particular motion vector is below a certain threshold, then zero motion is assumed in order to ensure that no motion is detected in regions of constant texture and to reduce the source entropy coding rate as the zero-motion vector is coded with run-length codes. A motion vector is preferably obtained for each block.

Again, in alternate embodiments, particularly non-video embodiments, this processing step may be bypassed.

Recall that in order to compress signals for transmission (i.e., the motion vectors in the illustrated embodiment), a symbol set is typically utilized. More particularly, an array, or other suitable data structure or conventional storage device, is preferably used as a catalogue representative of each unique symbol (presently, each unique motion vector) and its rate of occurrence, processing block 605.

An initial coding rate is calculated to determine the exact number of bits required to compress the symbols representing the motion vectors to be transmitted, processing block 606. This is preferably accomplished without generating the Huffman Code itself. The preferred processing steps for calculating an initial coding rate are more fully discussed in U.S. patent application Ser. No. 08/399,084 Attorney Docket No. Rosenberg 2, which is commonly assigned to the assignee of the present invention and which is incorporated herein by reference.

A variable representing the current coding rate is preferably set equal to the initial coding rate, processing block 607.

Recall that communication systems have limited bandwidth, i.e., a maximum rate at which bits may be transferred per a given time period. Recall further that compression techniques, and in particular Huffman Coding techniques, are incorporated into conventional signal compressing systems to increase information throughput, i.e., the number of codewords transferred given the available bandwidth. A determination of whether the current coding rate is greater than the maximum rate is made, decisional block 608. If the current Huffman Coding rate is greater, YES branch of decisional block 608, then the current coding rate must be modified. This is preferably accomplished by selectively reducing the current coding rate, processing block 609. The preferred processing steps for selectively reducing the current coding rate are more fully discussed in U.S. patent application Ser. No. 08/400,706 Attorney Docket No. Rosenberg 3, which is commonly assigned to the assignee of the present invention and which is incorporated herein by reference. The process repeats these steps until the current coding rate is less than or equal to the maximum rate, decisional block 608.

If the current coding rate is less than or equal to the maximum rate, NO branch of decisional block 608, then a Huffman Code is generated in accordance with the principles of the present invention, processing block 610. The preferred processing steps for generating the Huffman Code are discussed more fully with reference to FIG. 7.

In the illustrated embodiment, the codewords are preferably retrieved from a code book, processing block 611. A representative bit stream is generated, which in the illustrated embodiment represents the reconstructed video frame, processing block 612.

Figure 7:
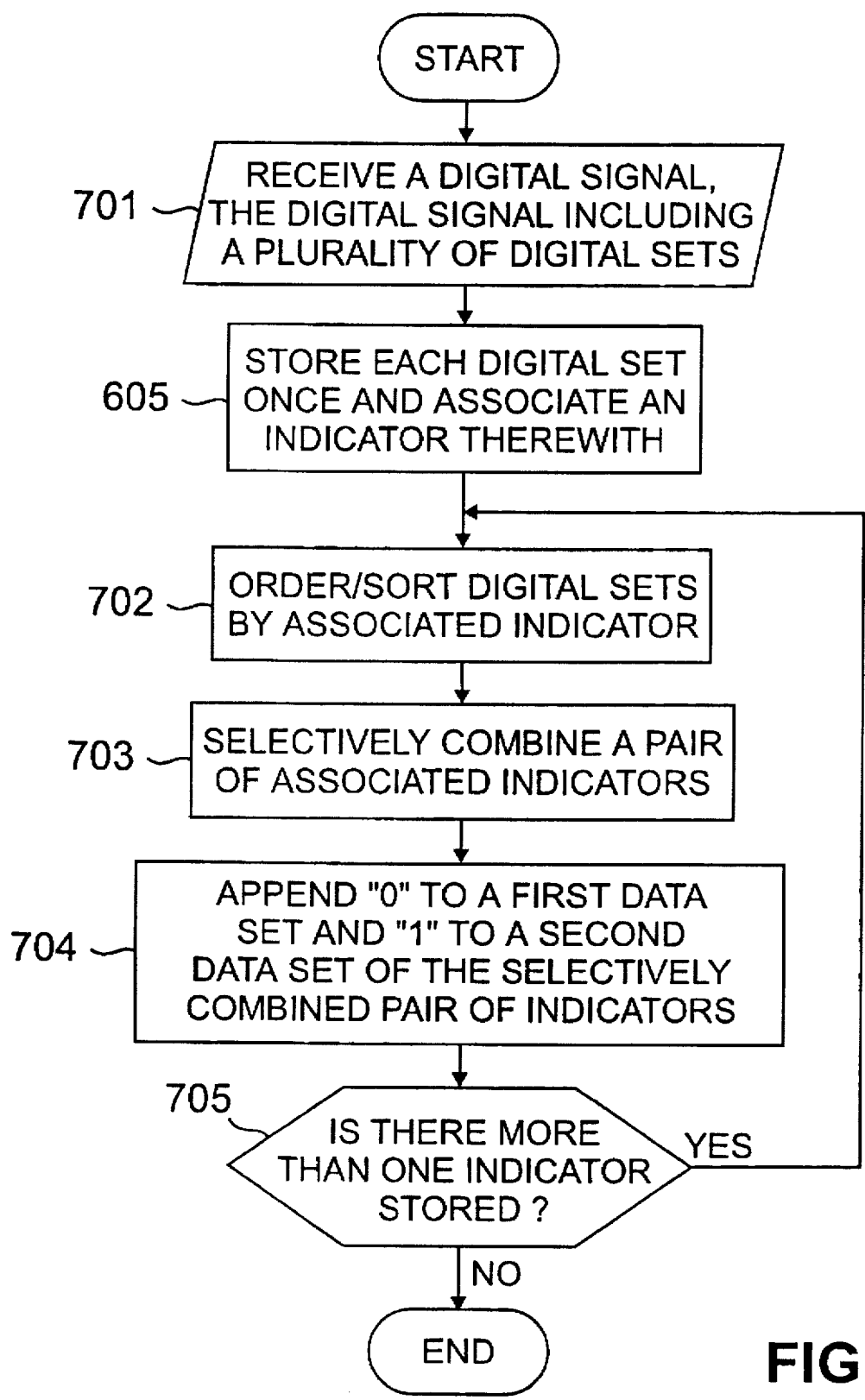
FIG. 7 illustrates an exemplary flow diagram for generating a Huffman Code in accordance with the principles of the present invention.

FIG. 7 illustrates an exemplary flow diagram for generating a Huffman Code, preferably in the form of a Huffman Table, in accordance with the principles of the present invention. The Huffman Table is a data structure which is preferably of a fixed size, such as an array, for example, and does not require dynamic memory management to be maintained. Suitably arranged conventional memory storage devices may be utilized.

The process begins upon receipt of a digital signal, input/output block 701. The digital signal includes a plurality of digital sets wherein ones of the plurality of digital sets are non-unique. Each of the digital sets is stored once and has a codeword and an indicator associated therewith, processing block 605. Each indicator represents a probability of occurrence of its associated digital set within the digital signal.

In the illustrated embodiment, each digital set represents a symbol, or more particularly, a motion vector, as discussed with reference to processing block 605 of FIG. 6.

The digital sets are preferably ordered or sorted by their associated indicator, processing block 702. A first associated indicator of a first digital set and a second associated indicator of a second digital set are selectively combined, preferably such that the indicators combined have the least probability of occurrence, processing block 703. The selectively combined indicator is now associated with both the first and second digital sets.

A first binary value, such as a "0" for example, and a second binary value, such as a "1" for example, are appended to the associated codewords of the first and second digital sets, respectively, processing block 704.

A determination is made as to whether more than one indicator remains stored, decisional block 705. Upon a determination that one indicator is stored, NO branch of decisional block 705, the process terminates. Alternatively, upon a determination that more than one indicator is stored, YES branch of decisional block 705, the process returns to processing block 702.

An important aspect of the foregoing processing steps is that a Huffman Code is generated which does not require dynamic memory management. Note that at each process stage, when two indicators are combined, the length of every codeword associated with every digital set associated with the new combined indicator increases in length by one. Further, all of the symbols associated with one of the children of the new combined indicator has a binary O appended to its Huffman Code, and all the symbols associated with the other child have a binary "1" appended to their Huffman Code.

Every new combined indicator, indicator i, in a given stage is therefore associated with a set of symbols, $R_i$, which are a subset of the set of all symbols, Z. When two indicators are combined, the new combined indicator becomes associated with $R_1 \cup R_2$. To generate the Huffman Code, a "0" is preferably appended to the codeword of every member of $R_1$, and a "1" is preferably appended to every member of $R_2$. This process is iterated until the Huffman Code is generated.

In other words, while more than one associated indicator remains stored, pairs of associated indicators are combined selectively such that the first digital set associated with the first indicator and the second digital set associated with the second indicator are both associated with the selectively combined indicator. Further, the first and second binary values are assigned to the codewords associated with the first and second digital sets, respectively.

At every stage in the process, only two pieces of information are preferably maintained. The first is a list of all the current indicators, with the rate of occurrence and a pointer to the set of symbols $R_i$ with which it is associated. The second piece is the set of $R_i$. Since $R_i$ is always disjoint and always union to Z, it may suitably be stored in a fixed space.

The notion of a set may be further maintained by linking every symbol to the next symbol in the set. The last symbol in a set is linked to nothing, or includes a null pointer. To join two $R_i$, the pointer at the end of one set is linked to the first symbol in the next set.

Assume for example that there are four symbols, A, B, C and D; that initially there are four nodes, one corresponding to each of the four symbols; and that the four nodes have associated therewith rates of occurrence of 2, 4, 5 and 7, respectively.

At a first stage, nodes 2 and 4 are combined, and the set of symbols associated with node 2 ("A") have a "0" appended to their Huffman Codewords, and the set of symbols associated with node 4, ("B") have a "1" appended to their Huffman Codewords. The two sets of symbols are preferably linked together, and become associated with the new node 6. At a second stage, nodes 6 and 5 are combined. All of the symbols associated with node 6 ("A, B") have a "0" appended to their Huffman Codewords, and all of the symbols associated with node 5 ("C") have a "1" appended to their Huffman Codewords. The two sets are preferably joined, and become associated with the new node 11. At a third stage, the final two nodes 11 and 7 are combined. The set of symbols ("A, B, C") associated with node 11 have a "0" appended to their Huffman Codewords, and the set of symbols ("D") associated with node 7 have a "1" appended to their Huffman Codewords. The two sets are combined, and associated with the new node 18. With only one node remaining, the procedure is complete.

An important aspect of the illustrated process is that the parent-child relationships need not be maintained. The only relationships that need to be kept are the association of the top nodes with their symbols. Since the number of top nodes starts at N and decreases by one at every stage, and since the lists require O(N) space, the entire algorithm requires only O(N) space as well, and without dynamic memory management. Accordingly processing system resource requirements are advantageously reduced.

Recall that a preferred embodiment for using and/or distributing the present invention is software. The software embodiment may be implemented in any suitable programming language. A preferred "C" programming language implementation for performing the aforementioned processing steps is attached herewith as an appendix. The preferred implementation requires that only the rates be stored, and not the connections between the symbols. At every stage, the two smallest occurrence rates are combined and added to the accumulator. The combined rate takes the place of the two smallest occurrence rates. The procedure iterates until there is one rate remaining.

Although the present invention and its advantages have been described in detail, it should be understood that various changes, substitutions and alterations can be made herein without departing from the spirit and scope of the invention.

APPENDIX

```
/* ************************************************************ */
/*      int MakeHuff(int NumberSymbols, int *rates, int *motiov)  */
/*                                                                */
/* Inputs: Number of symbols, their rates of occurrence, and the  */
/*      motion vector that they correspond to.                    */
/* Outputs: No. Bits needed for Huffman code                      */
/* Effects: Fills the Huffman table pointed to in FrameData with  */
/*      the local table. Uses a small, constant space             */
/*      algorithm.                                                */
/ ************************************************************/
int MakeHuff (int NumberSymbols, int *rates, int *motionv)
{
    typedef struct ITEM {
        int mv;
        struct ITEM *next;
    } Item;
    typedef struct NODE {
        int rate;
        Item *children;
    } Node;
    int i, top, bottom, curmv, currate, current;
    Node NodeList[140];
    Node NewNode;
    Item ItemList[140];
    int Bits = 0;
    Item *pitem;
    for(i = 0; i < NumberSymbols; i++)
    {
        if((motionv[i] < 0) || (motionv[i] > 990))
            printf("Bad mv for Huff\n");
        if((rates[i] < 0) || (rates[i] > 140)) printf("Bad rate\n");
                NodeList[i].rate = rates[i];
        NodeList[i].children = &(ItemList[i]);
        NodeList[i].children->mv = motionv[i];
        NodeList[i].children->next = NULL;
        FrameData.LocalTabSymbol[motionv[i]] = 0;
                FrameData.LocalTabLength[motionv[i]] = 0;
    }
    top = 0;
    bottom = NumberSymbols - 1;
    while(top < bottom)
    {
        NewNode.rate = NodeList[top].rate + NodeList[top+1].rate;
                NewNode.children = pitem = NodeList[top].children;
        while(pitem->next != NULL)
        {
            curmv = pitem->mv;
            FrameData.LocalTabSymbol[curmv] <<=1;
            FrameData.LocalTabSymbol[curmv] += 0;
            FrameData.LocalTabLength[curmv] += 1;
            pitem = pitem->next;
        }
        pitem->next = NodeList[top+1].children;
        curmv = pitem->mv;
        FrameData.LocalTabSymbol[curmv] <<= 1;
                FrameData.LocalTabSymbol[curmv] += 0;
        FrameData.LocalTabLength[curmv] += 1;
        pitem = pitem->next;
        while(pitem != NULL)
        {
            curmv = pitem->mv;
            FrameData.LocalTabSymbol[curmv] <<=1;
```

APPENDIX-continued

```
            FrameData.LocalTabSymbol[currmv] += 1;
            FrameData.LocalTabLength[currmv] += 1;
        pitem = pitem->next;
        }
        currate = NewNode.rate;
        Bits += currate;
        current = ++top;
        while((current < bottom) && (currate >
                NodeList[current + 1].rate))
        {
            NodeList[current] = NodeList[current + 1];
            ++current;
        }
        NodeList[current] = NewNode;
    }
    return(Bits);
}
```

I claim:

1. A method for generating a data structure representing a Huffman Code for use in compressing a digital signal, said digital signal including a plurality of symbols to be coded, said method comprising the steps of
   (a) generating a plurality of digital sets representing the symbols to be coded, each said stored digital set comprising a pointer to a list of codewords and an indicator, said indicator representing a probability of occurrence of the symbol corresponding to said digital set within said digital signal;
   (b) selecting a first associated indicator for a first digital set and a second associated indicator for a second digital set;
   (c) combining said first selected indicator and said second selected indicator to form a combined indicator;
   (d) appending a first binary value to all codewords pointed to by the pointer associated with said first digital set and appending a second binary value to all codewords pointed to by the pointer associated with said second digital set;
   (e) linking together the list pointed to by the pointer associated with the first digital set and the list pointed to by the pointer associated with the second set;
   (f) associating a new digital set with the combined indicator and a pointer to the combined lists; and
   (g) repeating steps (b)–(f) if more than one associated indicator remains.

2. The method as set forth in claim 1 wherein said selecting step is preceded by the step of determining whether more than one indicator remains stored.

3. The method as set forth in claim 2 further including the step of compressing said digital signal upon a determination that one indicator remains stored.

4. The method as set forth in claim 1 further including the step of receiving said digital signal.

5. The method as set forth in claim 1 further including the steps:
   receiving an analog signal; and
   converting said analog signal to said digital signal.

6. The method as set forth in claim 5 wherein said analog signal is a video signal, and further includes the step of storing said video signal on a video frame by video frame basis.

7. The method as set forth in claim 6 wherein ones of said plurality of digital sets represent a motion vector, and further includes the step of comparing ones of said motion vectors with a threshold value.

8. The method as set forth in claim 7 further including the step of initializing, in response to said comparison step, particular ones of said motion vectors.

9. The method as set forth in claim 1 wherein said selecting step further includes the step of sorting said associated indicators.

10. An apparatus for generating a Huffman Code for use in compressing a digital signal, said apparatus comprising:
    means for receiving said digital signal, said digital signal including a plurality of symbols to be coded;
    storage means for storing a plurality of digital sets representing the symbols to be coded; and
    processing means for generating said Huffman Code, said processing means operable to:
    (a) associate with each said stored digital set a pointer to a list of codewords and an indicator, said indicator representing a probability of occurrence of the symbol corresponding to said digital set within said digital signal;
    (b) select a first associated indicator for a first digital set and a second associated indicator for a second digital set;
    (c) combine said first indicator and said second indicator to form a combined indicator;
    (d) append a first binary value to all codewords pointed to by the pointer associated with said first digital set and append a second binary value to all codewords pointed to by the pointer associated with said second digital set;
    (e) link together the list pointed to by the pointer associated with the first digital set and the list pointed to by the pointer associated with the second digital set;
    (f) associate a new digital set with the combined indicator and a pointer to the combined lists; and
    (g) repeat steps (b)–(f) if more than one associated indicator remains.

11. The apparatus as set forth in claim 10 wherein said processing means is further operable to determine whether more than one indicator remains stored.

12. The apparatus as set forth in claim 11 wherein said processing means is further operable to generate said Huffman Code upon a determination that one indicator remains stored.

13. The apparatus as set forth in claim 10 wherein said processing means includes at least one processing unit.

14. The apparatus as set forth in claim 10 wherein said storage means is further operable to store a plurality of processing system instructions for directing said processing means to generate said Huffman Code.

15. The apparatus as set forth in claim 14 wherein said processing means is further operable to retrieve and execute selected ones of said plurality of processing system instructions.

16. The apparatus as set forth in claim 10 further including:

an input port for receiving an analog signal; and an analog-to-digital converter operable to convert said analog signal to said digital signal.

17. The apparatus as set forth in claim 16 wherein said analog signal is a video signal, and said processing means is further operable to store said video signal on a video frame by video frame basis.

18. The apparatus as set forth in claim 10 wherein ones of said plurality of digital sets represent a motion vector, and said processing means is further operable compare ones of said motion vectors with a threshold value.

19. The apparatus as set forth in claim 18 wherein said processing means is further operable to initialize, in response to said comparison, particular ones of said motion vectors.

20. The apparatus as set forth in claim 10 wherein said processing means is further operable to sort said associated indicators.

21. The apparatus as set forth in claim 10 wherein said apparatus is implemented within a telephony system.

22. The apparatus as set forth in claim 21 wherein said telephony system includes means for providing videophone services.

23. A method for generating a Huffman Code for use in compressing a digital signal, said method comprising the steps of:

(a) receiving said digital signal, said digital signal including a plurality of symbols to be coded;

(b) storing each one of said symbols once and generating a plurality of corresponding digital sets by associating with each said symbol a pointer to a list of codewords and an indicator, said indicator representing a probability of occurrence of the symbol corresponding to said digital set within said digital signal;

(c) sorting said associated indicators;

(d) selectively combining a first associated indicator of a first digital set and a second associated indicator of a second digital set to form a combined indicator;

(e) appending a first binary value to all codewords pointed to by the pointer associated with said first digital set and a second binary value to all codewords pointed to by the pointer associated with said second digital set;

(f) linking together the list pointed to by the pointer associated with the first digital set and the list pointed to by the pointer associated with the second digital set;

(g) associating a new digital set with the combined indicators and a pointer to the combined lists; and (h) returning, upon a determination that more than one associated indicator remains stored, to step (c) and repeating steps (c)–(g).

24. The method of claim 1 further comprising the step of:

removing the first and second digital sets from consideration during processing subsequent to said step of associating a new digital set.

25. The apparatus of claim 10 wherein said processing means is further operable to:

remove the first and second digital sets from consideration during processing subsequent to said operation to associate a new digital set.

26. The method of claim 23 further comprising the step of:

removing the first and second digital sets from further consideration during processing subsequent to said step of associating a new digital set.

* * * * *